(12) United States Patent
Mallinson

(10) Patent No.: US 6,822,516 B2
(45) Date of Patent: Nov. 23, 2004

(54) HIGH SPEED HIGH GAIN AMPLIFIER

(75) Inventor: Andrew Martin Mallinson, Kelowna (CA)

(73) Assignee: ESS Technology, Inc., Fremont, CA (US)

( * ) Notice: Subject to any disclaimer, the term of this patent is extended or adjusted under 35 U.S.C. 154(b) by 0 days.

(21) Appl. No.: 10/402,391

(22) Filed: Mar. 27, 2003

(65) Prior Publication Data
US 2004/0189397 A1 Sep. 30, 2004

(51) Int. Cl.[7] ................................................. H03F 3/68
(52) U.S. Cl. ................................. 330/295; 330/124 R
(58) Field of Search ............................. 330/124 R, 253, 330/277, 295, 148

(56) References Cited
U.S. PATENT DOCUMENTS 4,319,199 A * 3/1982 Sunderland
5,621,374 A * 4/1997 Harkin
6,285,251 B1 * 9/2001 Dent et al. ............... 330/124 R
6,700,440 B2 * 3/2004 Hareyama ................... 330/297

* cited by examiner

Primary Examiner—Khnah Van Nguyen
(74) Attorney, Agent, or Firm—Stevens Law Group P.C.

(57) ABSTRACT

An electronic device is provided such as an amplifier, for example, having improved gain and transconductance and low output impedance. The device includes a primary amplifier configured to carry an operating load. The primary amplifier includes an input for receiving an input signal, and an output for outputting an output signal, and operates having a variable output, as it carries an operational load. The device further includes a secondary amplifier configured to operate at a fixed operating condition, not burdened by carrying an operational load, and includes a secondary input configured to receive the input signal, wherein the secondary amplifier is configured to define the input voltage. The device is configured to detect a difference in operating current between the primary and secondary amplifiers, and to compensate for any operational load that may be applied to the primary amplifier during operation.

3 Claims, 3 Drawing Sheets

HIGH SPEED HIGH GAIN AMPLIFIER

BACKGROUND

The invention generally relates to electronic amplifiers and, more particularly, to a high speed high gain amplifier having replica amplifiers for controlling operating conditions.

In the design of low cost CMOS analog processing chips the main "building block" is the CMOS operational amplifier. There are many implementations and some architectures are designed to make use of very simple amplifiers that are similar to the CMOS logic gates. See for example, "A 10-b 20-MHZ 30-mW Pipelined Interpolating CMOS ADC" IEEE Journal of Solid-State Circuits, Vol 28 No 12 Dec. 1993, Kusumoto et al. Referring to FIG. 1, a conventional amplifier 100 is illustrated that includes a single NMOS device M1 101 operating at a defined drain current from current source G1 102, which is connected between a reference voltage vdd 104 and ground, 106. The input signal is received at input 108. The output signal is delivered to output 110. This circuit is an inverting amplifier because as the input node is adjusted upward, the output node will be pulled down. This configuration is referred to as a common source amplifier. The problems associated with a circuit such as this circuit include a high output impedance and relatively low gain. A more conventional amplifier is commonly developed from this simple NMOS device by cascading a number of gain stages and by applying feedback to reduce the output impedance and increase the gain. Such a configuration has errors of the common source CMOS amplifier due to the output voltage disturbance and consequent output current change. The problem with this circuit is that a device configured with such a circuit is vulnerable to changes in operating point factors. As current is drawn by outside forces at the output of an amplifier, the input detects the change at the input via the feedback loop and draws current to correct it. This correction causes a decrease in the amplifier's gain and transconductance, as well as an increase in output impedance.

These amplifiers are also transconducting devices, which are electronic building blocks characterized by a current output derived from a voltage input in a linear relationship $I_{out}=G_m*V_{in}$, where $G_m$ is the transconductance term, and where Seimens (S) is the standard unit of $G_m$ in Amps/Volt. Generally, the value of $G_m$ in a conventional amplifier is fixed and is determined by the circuit elements. Thus, the $G_m$ is fixed when the circuit is manufactured. It is possible, however, to vary the $G_m$ using programmable means on a circuit chip. In such a configuration, the $G_m$ could be varied by such programmable means according to a run-time configuration, rather than a predetermined configuration. These devices are used in programmable linear filters, gain amplifiers and other general purpose linear processing elements.

Therefore, there exists a need for amplifiers that have improved performance factors and that are sensitive and responsive to changes in operating conditions that affect performance. As will be seen below, the invention accomplishes improved performance factors in an elegant manner.

SUMMARY OF INVENTION

The invention provides an electronic device, such as an amplifier, having improved gain and transconductance and low output impedance. The device includes a primary amplifier configured to carry an operating load. The primary amplifier includes an input for receiving an input signal, and an output for outputting an output signal. The primary amplifier operates having a variable output, as it carries an operational load. The device further includes a secondary amplifier configured to operate at a fixed operating condition, not burdened by carrying an operational load. The secondary amplifier includes a secondary input configured to receive the input signal, wherein the secondary amplifier is configured to define the input voltage. The device is configured to detect a difference in operating current between the primary and secondary amplifiers, and to compensate for any operational load that may be applied to the primary amplifier during operation.

The device may further include an adjustment circuit configured to define a feed-forward path with the secondary amplifier. The adjustment circuit includes a comparator configured to compare the input voltage to a reference voltage of the primary comparator. The adjustment circuit is configured to adjust the output current in response to changes in voltage resulting from the operational load on the primary amplifier that may occur at the primary output. The circuit is thus configured to compensate for voltage fluctuations occurring in operation of the primary amplifier.

DETAILED DESCRIPTION

Figure 1:
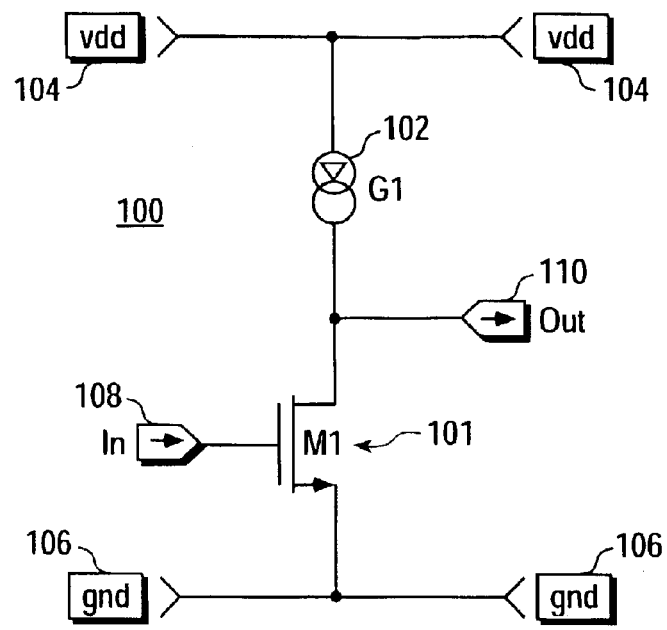
FIG. 1 is a diagrammatic view of a conventional amplifier circuit.

The invention provides an electronic device described in embodiments below for operation in a feedback amplifier configuration. The invention provides a device having a reduced output impedance and improved gain and transconductance. The device includes a primary amplifier configured to carry an operating load. The primary amplifier includes an input for receiving an input signal, and an output for outputting an output signal. The primary amplifier operates having a variable output, as it carries an operational load. The device further includes a secondary amplifier configured to operate at a fixed operating condition, and not burdened by carrying an operational load. The secondary amplifier includes a secondary input configured to receive the input signal, wherein the secondary amplifier is configured to define the input voltage. The device is configured to detect a difference in operating current between the primary and secondary amplifiers, and to compensate for any operational load that may be applied to the primary amplifier during operation. Thus, the secondary amplifier operates in a mode where no operational loads are placed on it. In a preferred embodiment, the secondary amplifier is a replica of the primary amplifier, and simulates the operation of the primary amplifier without any operational loads at its output. Thus, any differences in operation between the two amplifiers can be assumed to be a result of the operational load on the primary amplifier. Quantifying this difference enables the device to compensate for the operational loads imposed upon the primary amplifier. This gives the compound device increased gain because the variable load required by the output is provided via the secondary path from the replica amplifier.

The device further includes an adjustment circuit configured to define a feed-forward path with the secondary amplifier The adjustment circuit is configured to adjust the output current in response to changes in voltage resulting from the operational load on the primary amplifier that may occur at the primary output. Specifically, the output load will cause the input to the primary amplifier to change via the feedback network and the primary amplifier will initially move to compensate for this changed output load. The primary amplifier must adjust its operating point because it has finite $G_m$ and the current has just changed at its output node due to the load condition changing. However, since the primary and secondary amplifier share a common input point, this adjustment to the primary amplifier operating point causes a change to the secondary amplifier operating point. This change at the secondary amplifier causes an imbalance at the output of the secondary amplifier since it does not experience the changed load condition. This imbalance at the output of the secondary amplifier is used by the adjustment circuit to change the operating point of the primary amplifier back to its initial condition. Thus, the changing load condition is handled not by the primary amplifier but by the adjustment circuit connected to the secondary amplifier. By virtue of the higher gain path through the secondary amplifier and the adjustment means, the output change has been accommodated without any significant change to the primary amplifier operating point. Thus the overall amplifier has higher gain and higher transconductance.

The invention is described below in one embodiment in the context of an amplifier having replicated amplifier devices for operating with increased gain and transconductance. It will be appreciated by those skilled in the art, however, that other useful applications of the invention may be implemented without departing from the spirit and scope of the invention, where the scope is defined in the appended claims.

As discussed above, conventional common source CMOS amplifiers generate errors due to the output voltage disturbance and output current change errors as referred to the input. In high speed and high gain applications however, it is important to meet a given output condition, where an adjustment from the nominal bias point is required at the input. At the extreme, if the output need not adjust in voltage and if the output were to take no current there would be no error in the amplifier. However, once loads are placed on the circuit, the errors abound from the operating conditions of the loaded amplifier. According to the invention, errors in open loop voltage gain and output transconductance may be compensated for in response to a changing input voltage.

Figure 2:
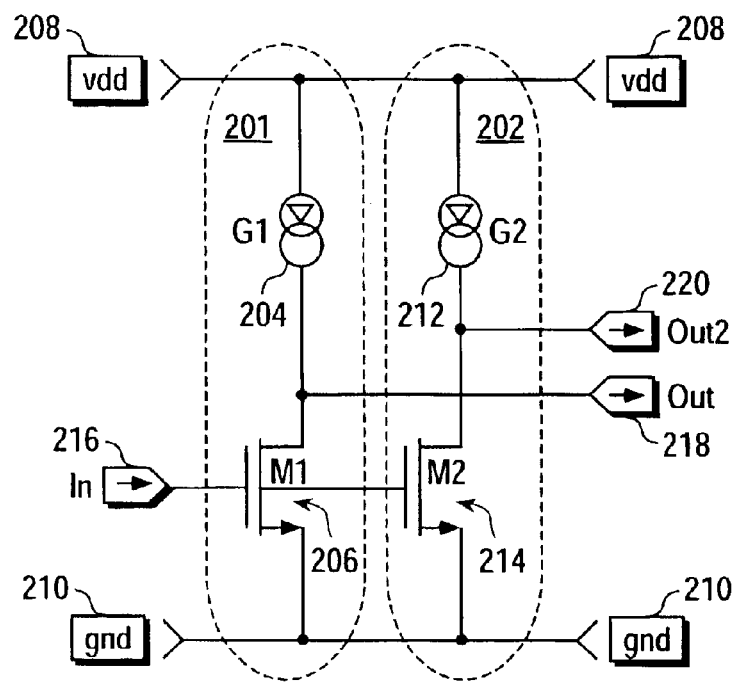
FIG. 2 is a diagrammatic view of an amplifier circuit according to the invention.

Referring to FIG. 2, one embodiment of the invention is illustrated, where the amplifier circuit 200 is configured with primary transistor circuit 201 and a parallel operating secondary transistor circuit 202. The primary transistor circuit includes a primary current source G1 204 and a primary transistor amplifier M1 206, connected between a reference voltage 208 and ground 210. The secondary transistor circuit includes a secondary current source G2 212 and a secondary transistor amplifier M2 214, which are connected in parallel with the primary transistor circuit between reference voltage 208 and ground 210. The secondary transistor circuit, replicating the ground and input connection, acts as a replica amp to mimic the operation of the primary circuit. In a preferred embodiment, both the primary transistor circuit and secondary circuit have substantially similar parameters, so that secondary transistor circuit will properly mimic the primary transistor circuit. The input 216 is the same input to both amplifiers 206, 214, and the outputs from the primary and secondary transistor circuits are 218 and 220 respectively. According to the invention, if the secondary output 220 were to be fixed in voltage and have no current drawn from it, then the voltage at the input node 216 to the second amplifier would be fixed. Since the input to the first amplifier 206 is the same as the input to the second amplifier 214, if the second amplifier is maintained in the condition of fixed output voltage and there is no output current change, the first amplifier must have an input voltage that is also unchanging. If the input voltage is unchanging, the amplifier has the desirable high gain and high transconductance for high speed signal applications. According to the invention, a second amplifier is maintained in a fixed operating condition to define the voltage at the input, and the first amplifier is configured to operate at a variable output voltage and current. The effects of the operating load on the primary amplifier can be determined as the difference between the operating parameters of the primary and secondary amplifiers.

It may be observed that the errors of the common source CMOS amplifier may be considered to be due to the output voltage disturbance and output current change of a device. In operation, the changes to output voltage and current require that the input node adjust to maintain the amplifier operation. It is important to consider the errors in the amplifier as referred to the input. Specifically, in order to meet a given output condition, the adjustment from the nominal bias point required at the input needs to be determined. Errors in open loop voltage gain and output transconductance may be considered as this changing input voltage. Furthermore, it is observed that if the output need not adjust in voltage and if the output were to take no current there would be no error in the amplifier. However, the amplifier would be useless if these conditions prevailed.

Figure 3:
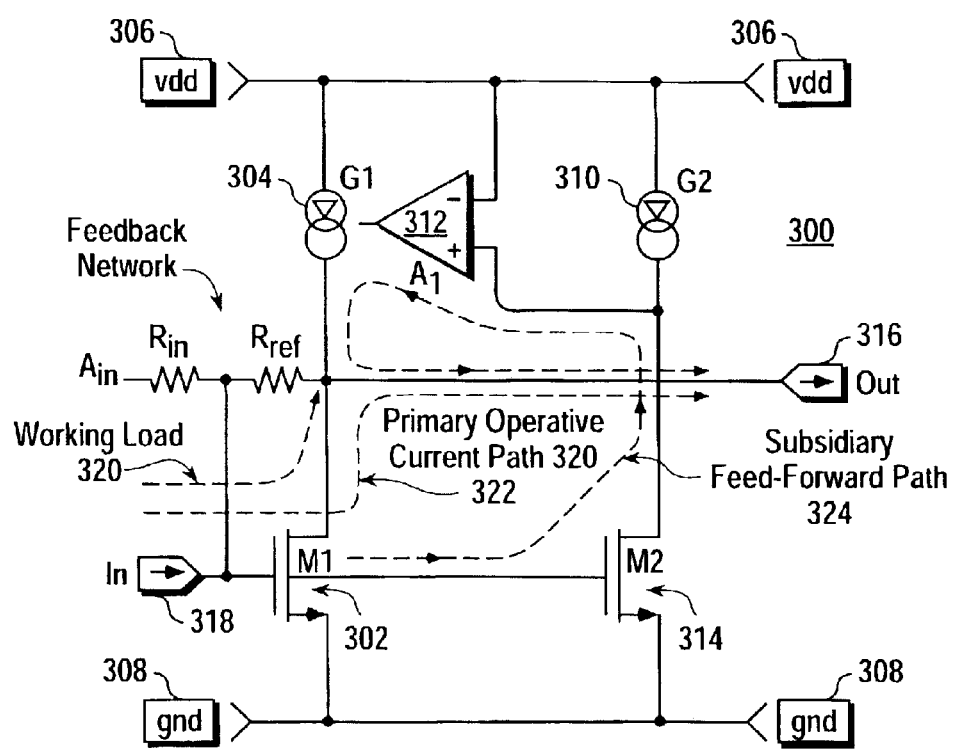
FIG. 3 is a diagrammatic view of an amplifier circuit according to the invention.

Referring to FIG. 3, another embodiment of the invention is illustrated. The amplifier circuit 300 includes a primary amplifier circuit that consists of the primary amplifier M1 302 and corresponding current source G1 304, which are connected between a reference voltage 306 and round 308. The secondary amplifier circuit includes secondary amplifier current source G2 310.

According to the invention, the bias point of the first amplifier can be adjusted by adjustment means, illustrated as current adjuster circuit 312, according to the operational properties of the secondary amplifier 314, which operates absent the operational loads placed on the first amplifier. This operates as a replica amplifier to the primary amplifier. Changes in output voltage and current load can be provided through the current generator 304 in response to an input signal from the current adjuster. If the adjuster circuit is designed to take no current from the second amplifier and the adjustment point is not required to change in voltage, we have met the condition for the second amplifier to define the input voltage and the first amplifier to operate normally.

The circuit 300 is a compound amplifier, where a primary operative current path 320, which begins at the input 318, where the input signal is received in the circuit. The signal travels through the primary amplifier 302, then directly to the output 316. The output is driven via the subsidiary feed forward path 324, which begins at the input, travels through the secondary amplifier 314, up through the current adjuster circuit 312, which governs the current source 304 to apply current forward and out to the output 316. Configured according to the invention, the output of this circuit 300 has high gain because the subsidiary path that travels from the input, through the second amplifier and through the current generator adjuster is driving the output. This is a high gain signal path from input to output.

According to the invention, the secondary amplifier and current adjustment means operate as a correction factor for the first amplifier. The secondary amplifier operates without an operational load on it. Therefore, it is a model for the primary amplifier operating without a load. Thus, the difference in operational characteristics between the two amplifiers can be assumed to be a result of the working load 320 operating on the primary amplifier, which affects the current travelling the primary operative current path 322 to deliver the output to output 316. The current adjustment means is configured to detect this difference, and to compensate for it through the subsidiary feed-forward path 324. The detection is accomplished because the feedback circuit is adjusting the input to both the primary and secondary amplifiers, and the outputs of the primary and secondary amplifiers must then diverge since only the primary amplifier has the changing load condition. The primary amplifier bias point is adjusted by the secondary amplifier, and all changes in output voltage and current load is provided through the primary current source 304 via the subsidiary feed-forward loop 322.

The usable bandwidth of the circuit is defined by the phase shift of the first amplifier 302 at high frequency. The presence of the first amplifier adding current to the output causes the phase shift at high frequency to recover to that of the primary amplifier. However at low frequency the characteristics are dominated by those of the secondary amplifier and the adjustment means. Thus the invention has the desirable low frequency characteristics of a multistage amplifier (high gain low noise) and the desirable high frequency characteristic of the single stage primary amplifier (low phase shift at high frequency). Typically therefore, the compound amplifier 300 will have a second or higher order characteristic to be useful up to the bandwidth of the first amplifier. The noise at low frequency is defined by the second amplifier 314. In one embodiment, this fact can be exploited by making the second amplifier 314 a larger area device. For example, in the common implementation the current sources 304 and 310 would be similar and the devices M1 (302) and M2 (314) would be similar. However, a beneficial improvement to low frequency noise (so called 1/f noise) is known to occur if the area of a MOSFET device is increased. Consequently, the gate area of M2 (314) can be increased and the $G_m$ changed as desired as long as G2 (310) is also adjusted to maintain a nominal ratio to the current from G1 (304). Thus it is not a requirement of this invention that the primary and secondary amplifier be identical, only that they be sufficiently similar that a predictable operating point is achieved in both amplifiers. According to the invention, the lower bandwidth of the second amplifier is not critical to the operation of the amplifier circuit 300.

Figure 4:
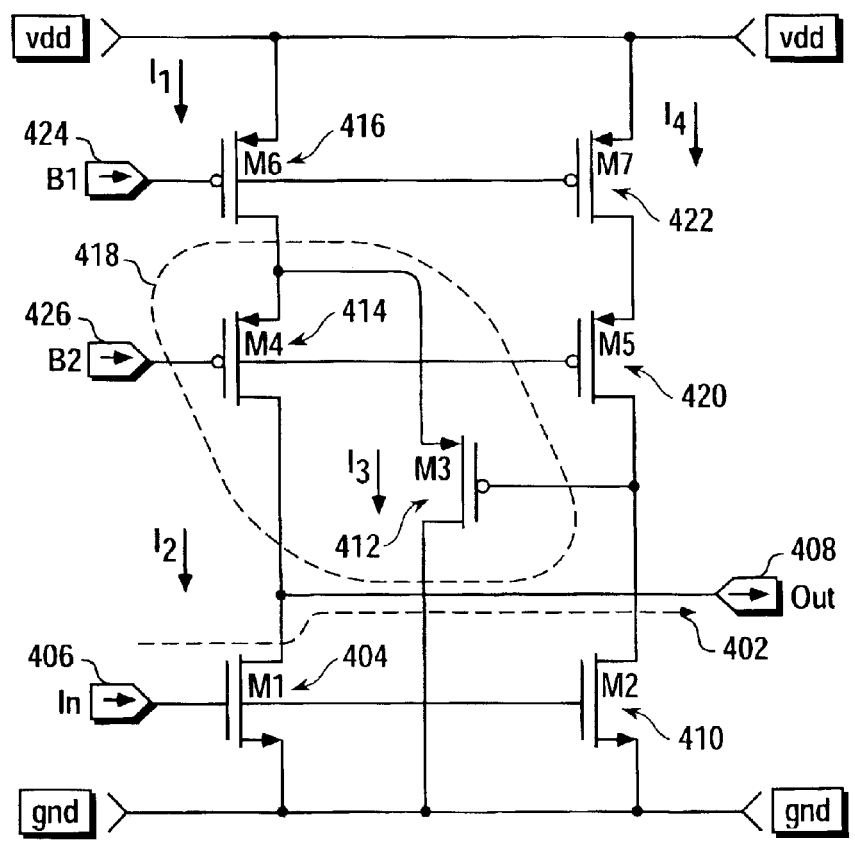
FIG. 4 is a diagrammatic view of an amplifier circuit according to the invention.

Referring to FIG. 4, in another embodiment of the invention, an implementation of a high gain amplifier 400 is illustrated. The primary high frequency operative current path 402 begins at the gate of the first amplifier 404 and the path from its input gate 406 and extends to its output drain 408. The second amplifier 410 is a replica amplifier, and operates in a non-loaded state. Current sources M3 412 and M4 414 form a PMOS long tailed pair 418. This long tailed pair is configured to adjust the fraction of the current $I_1$ that divides to currents $I_2$ and $I_3$ respectively, and flows through current source M6 416 and into the drain of primary amplifier M1 404. Current source M5 420 is a cascade connection to current source M7 422 that forms the constant current load of $I_4$ on the drain of secondary amplifier M2 410. Bias nodes B1 424 and B2 426 are bias nodes that set up the current sources M6 416 and M7 422. These provide a reference for the output of the secondary amplifier M2 410. In operation, the drain of secondary amplifier M2 402 will operate at the voltage of bias point B2 426. As an example of typical current levels in the devices, $I_1$ can operate at 200 micro-amperes ($\mu$A), where $I_2$, $I_3$, and $I_4$ operate at 100 $\mu$A. In practice, on a sub-micron CMOS process, without benefit of a circuit configured according to the invention, an amplifier consisting only of M1 may have a typical gain of 40 db and a bandwidth of 1 Ghz. In contrast, in a circuit configured according to the invention, the gain may be increased to typically 80 db and the unity gain bandwidth remains at 1 Ghz. Primary amplifier M1 and secondary amplifier M2 are generally similar devices.

In another embodiment of the invention, if the substrate width and length of M2 are increased by a factor of N compared to the width and length of M1, the inverse frequency (1/f) noise of the circuit will decrease by a factor of square-root N, and the bandwidth will be unaffected.

Thus, the invention provides a compound amplifier having increased gain, reduced output impedance and the potential for lower noise in a low power circuit. Furthermore, it will be evident to those skilled in the art that the NMOS and PMOS devices may be swapped, and Bipolar, GaAs or any similar device may be connected in the configurations described to realize the benefit of the invention.

The invention is described below in the context of embodiments of high speed high gain electronic amplifiers. It will be appreciated by those skilled in the art, however, that other useful applications of the invention may be implemented without departing from the spirit and scope of the invention, where the scope is defined in the appended claims and any equivalents.

What is claimed is:

1. An electronic device having improved gain and transconductance, comprising:

a primary amplifier having an input for receiving an input signal, and an output for outputting an output signal, wherein the primary amplifier operates having a variable output; and a secondary amplifier configured to operate at a fixed operating condition, having a secondary input configured to receive the input signal, wherein the secondary amplifier is configured to define the input voltage, wherein the secondary amplifier further includes an adjustment circuit configured to adjust the input current in response to changes that may occur at the at the primary output.

2. An electronic device according to claim 1, wherein the primary amplifier operates with a variable current and voltage.

3. An electronic device according to claim 1, further comprising an adjustment circuit configured to define a feed-forward path in combination with the secondary amplifier, wherein the adjustment circuit includes a comparator configured to compare the input voltage of the secondary amplifier to the output voltage of the primary amplifier, and to adjust the input current in response to changes in output voltage that may occur at the primary output to maintain a constant operating current.

* * * * *